(12) United States Patent
Fukunaga et al.

(10) Patent No.: US 12,369,405 B2
(45) Date of Patent: Jul. 22, 2025

(54) SEMICONDUCTOR INTEGRATED CIRCUIT DEVICE

(71) Applicant: Socionext Inc., Kanagawa (JP)

(72) Inventors: Taro Fukunaga, Yokohama (JP); Masahisa Iida, Yokohama (JP); Toshihiro Nakamura, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 522 days.

(21) Appl. No.: 17/877,534

(22) Filed: Jul. 29, 2022

(65) Prior Publication Data
US 2022/0367442 A1 Nov. 17, 2022

Related U.S. Application Data

(63) Continuation of application No. PCT/JP2020/005063, filed on Feb. 10, 2020.

(51) Int. Cl.
*H10D 89/10* (2025.01)

(52) U.S. Cl.
CPC .................. *H10D 89/10* (2025.01)

(58) Field of Classification Search
CPC ..................................... H10D 89/10
See application file for complete search history.

(56) References Cited

U.S. PATENT DOCUMENTS

| | | | | |
|---|---|---|---|---|
| 5,824,570 A * | 10/1998 | Aoki | ............ | H10D 89/10 438/129 |
| 5,841,157 A * | 11/1998 | Kojima | ............ | H10D 89/10 257/210 |
| 5,917,206 A * | 6/1999 | Takamori | ............ | H10D 89/10 257/E27.105 |
| 6,222,213 B1 * | 4/2001 | Fujiwara | ............ | H10D 89/10 257/E27.11 |
| 6,836,026 B1 * | 12/2004 | Ali | ............ | H01L 24/06 257/E27.11 |
| 2002/0113319 A1 | 8/2002 | Ohno | | |
| 2003/0057549 A1 | 3/2003 | Sei | | |
| 2005/0127405 A1 * | 6/2005 | Chen | ............ | H10D 84/998 257/E27.11 |
| 2008/0308798 A1 * | 12/2008 | Komatsu | ............ | H01L 22/32 257/E23.002 |
| 2009/0109765 A1 * | 4/2009 | Mark | ............ | G11C 29/1201 257/E29.166 |

(Continued)

FOREIGN PATENT DOCUMENTS

| | | |
|---|---|---|
| JP | H10-261718 A | 9/1998 |
| JP | 2002-190526 A | 7/2002 |

(Continued)

OTHER PUBLICATIONS

International Search Report (ISR) dated Mar. 24, 2021 issued in International Patent Application No. PCT/JP2020/005063 with partial English translation.

*Primary Examiner* — Nathan W Ha
(74) *Attorney, Agent, or Firm* — Rimon P.C.

(57) ABSTRACT

In a semiconductor integrated circuit device, first and second IO cell rows are placed in an IO region on a chip. IO cells in the first IO cell row are larger in plane area than IO cells in the second IO cell row. Pads connected to the IO cells in the first IO cell row are located closer to an outer edge of the chip than any pads connected to the IO cells in the second IO cell row.

6 Claims, 8 Drawing Sheets

(56) References Cited

U.S. PATENT DOCUMENTS

| | | | |
|---|---|---|---|
| 2011/0089470 A1* | 4/2011 | Aoki | H10D 84/907 |
| | | | 257/E27.11 |
| 2011/0215420 A1* | 9/2011 | Hsueh | G06F 30/39 |
| | | | 257/E27.06 |
| 2012/0025272 A1 | 2/2012 | Usami | |
| 2013/0240954 A1 | 9/2013 | Usami et al. | |
| 2016/0284692 A1* | 9/2016 | Hung | H10D 89/10 |
| 2017/0221825 A1 | 8/2017 | Matsui et al. | |
| 2018/0269153 A1 | 9/2018 | Matsui et al. | |
| 2020/0135716 A1* | 4/2020 | Kim | H10D 84/0188 |
| 2020/0152588 A1* | 5/2020 | Chanumolu | H01L 24/06 |

FOREIGN PATENT DOCUMENTS

| | | |
|---|---|---|
| JP | 2003-100891 A1 | 4/2003 |
| JP | 2010-161158 A | 7/2010 |
| JP | 2012-235048 A | 11/2012 |
| WO | 2010/125619 A1 | 11/2010 |
| WO | 2016/063458 A1 | 4/2016 |

\* cited by examiner

SEMICONDUCTOR INTEGRATED CIRCUIT DEVICE

CROSS-REFERENCE TO RELATED APPLICATIONS

This is a continuation of International Application No. PCT/JP2020/005063 filed on Feb. 10, 2020. The entire disclosure of this application is incorporated by reference herein.

BACKGROUND

The present disclosure relates to a semiconductor integrated circuit device in which pads and IO cells are placed on a chip.

With the progress of miniaturization in semiconductor manufacturing processes, the scale of circuits mounted on a semiconductor chip is increasing and the circuit operation is becoming faster. This increases the number of IO terminals between the semiconductor chip and the outside and also speeds up interfaces (signal exchanges).

Japanese Unexamined Patent Publication No. 2003-100891 discloses an example of a semiconductor integrated circuit device in which two IO cell rows are placed along the periphery of a chip. In this example, IO cells in the outer row are connected to pads placed on the outer side, and IO cells in the inner row are connected to pads placed on the inner side.

In order to keep up with further speedup of interfaces, lines through which high-speed signals propagate need to be shortened as much as possible in a semiconductor chip. In the configuration of the cited patent document, however, since no consideration is made on the propagation of high-speed signals, it is difficult to keep up with speedup of interfaces. That is, in the cited configuration, when IO cells for high-speed signals are disposed in the outer row, the distance between the IO cells and the core region will be long, causing difficulty in the propagation of high-speed signals. By contrast, when IO cells for high-speed signals are disposed in the inner row, the distance between the IO cells and the pads will be long, causing difficulty in the propagation of high-speed signals.

An objective of the present disclosure is facilitating the propagation of high-speed signals through IO cells for high-speed signals in a semiconductor integrated circuit device in which a plurality of IO cell rows are placed.

SUMMARY

In one mode of the present disclosure, a semiconductor integrated circuit device includes: a chip; a core region provided on the chip; an IO region provided on the chip between the core region and an outer edge of the chip; a first IO cell row placed in the IO region, including at least two IO cells arranged in a first direction that is a direction along the outer edge; a second IO cell row placed in the IO region, including at least two IO cells arranged in the first direction, located between the first IO cell row and the outer edge; and a plurality of pads formed on a surface of the chip, individually connected to the IO cells in the first and second IO cell rows and electrically connected to the outside of the semiconductor integrated circuit device, wherein the IO cells in the first IO cell row are larger in plane area than the IO cells in the second IO cell row, and the pads connected to the IO cells in the first IO cell row are located closer to the outer edge than any of the pads connected to the IO cells in the second IO cell row.

According to the above mode, in the semiconductor integrated circuit device, first and second IO cell rows are placed in an IO region on a chip. The second IO cell row is placed between the first IO cell row and an outer edge of the chip. IO cells in the first IO cell row are larger in plane area than IO cells in the second IO cell row. That is, the IO cells in the first IO cell row, in which large-sized transistors can be provided, are suitable for configuration of circuits for propagation of high-speed signals. Pads connected to the IO cells in the first IO cell row are closer to the outer edge of the chip than any pads connected to the IO cells in the second IO cell row. Therefore, for the IO cells for high-speed signals arranged in the first IO cell row, the line length to internal circuits provided in the core region is short, and also the line length to the pads can be shortened. This reduces signal delays and thus permits propagation of high-speed signals.

In another mode of the present disclosure, a semiconductor integrated circuit device includes: a chip; a core region provided on the chip; an IO region provided on the chip, between the core region and an outer edge of the chip; a first IO cell row placed in the IO region, including at least two IO cells arranged in a first direction that is a direction along the outer edge; a second IO cell row placed in the IO region, including at least two IO cells arranged in the first direction, located between the first IO cell row and the outer edge; and a plurality of pads formed on a surface of the chip, individually connected to the IO cells in the first and second IO cell rows and electrically connected to the outside of the semiconductor integrated circuit device, wherein the IO cells in the first IO cell row are larger in plane area than the IO cells in the second IO cell row, and when the plurality of pads are divided into a first pad group and a second pad group closer to the outer edge than the first pad group, the first pad group includes pads connected to the IO cells in the second IO cell row in larger number than pads connected to the IO cells in the first IO cell row, and the second pad group includes pads connected to the IO cells in the first IO cell row in larger number than pads connected to the IO cells in the second IO cell row.

According to the above mode, first and second IO cell rows are placed in an IO region on a chip. The second IO cell row is placed between the first IO cell row and an outer edge of the chip. IO cells in the first IO cell row are larger in plane area than IO cells in the second IO cell row. That is, the IO cells in the first IO cell row, in which large-sized transistors can be provided, are suitable for configuration of circuits for propagation of high-speed signals. When a plurality of pads connected to the IO cells in the first and second IO cell rows are divided into a first pad group and a second pad group closer to the outer edge than the first pad group, the first pad group includes pads connected to the IO cells in the second IO cell row in larger number than pads connected to the IO cells in the first IO cell row, and the second pad group includes pads connected to the IO cells in the first IO cell row in larger number than pads connected to the IO cells in the second IO cell row. Therefore, for the IO cells for high-speed signals arranged in the first IO cell row, the line length to internal circuits provided in the core region is short, and also the line length to the pads can be shortened. This reduces signal delays and thus permits propagation of high-speed signals.

In yet another mode of the present disclosure, a semiconductor integrated circuit device includes: a chip; a core region provided on the chip; an IO region provided on the chip, between the core region and an outer edge of the chip; a first IO cell row placed in the IO region, including at least two IO cells arranged in a first direction that is a direction along the outer edge; a second IO cell row placed in the IO region, including at least two IO cells arranged in the first direction, located between the first IO cell row and the outer edge; and a plurality of pads formed on a surface of the chip, individually connected to the IO cells in the first and second IO cell rows and electrically connected to the outside of the semiconductor integrated circuit device, wherein the IO cells in the first IO cell row are larger in plane area than the IO cells in the second IO cell row, and at least one IO cell in the first IO cell row is connected to a pad of the plurality of pads located closer to the outer edge than the IO cell itself, and at least one IO cell in the second IO cell row is connected to a pad of the plurality of pads located farther from the outer edge than the IO cell itself.

According to the above mode, first and second IO cell rows are placed in an IO region on a chip. The second IO cell row is placed between the first IO cell row and an outer edge of the chip. IO cells in the first IO cell row are larger in plane area than IO cells in the second IO cell row. That is, the IO cells in the first IO cell row, in which large-sized transistors can be provided, are suitable for configuration of circuits for propagation of high-speed signals. At least one IO cell in the first IO cell row is connected to a pad located closer to the outer edge than the IO cell itself, and at least one IO cell in the second IO cell row is connected to a pad farther from the outer edge than the IO cell itself. Therefore, for the IO cells for high-speed signals arranged in the first IO cell row, the line length to internal circuits provided in the core region is short, and also the line length to the pads can be shortened. This reduces signal delays and thus permits propagation of high-speed signals.

According to the semiconductor integrated circuit device of the present disclosure, in which a plurality of IO cell rows are placed, the propagation of high-speed signals through IO cells for high-speed signals can be facilitated.

DETAILED DESCRIPTION

Embodiments of the present disclosure will be described hereinafter with reference to the accompanying drawings.

First Embodiment

Figure 1:
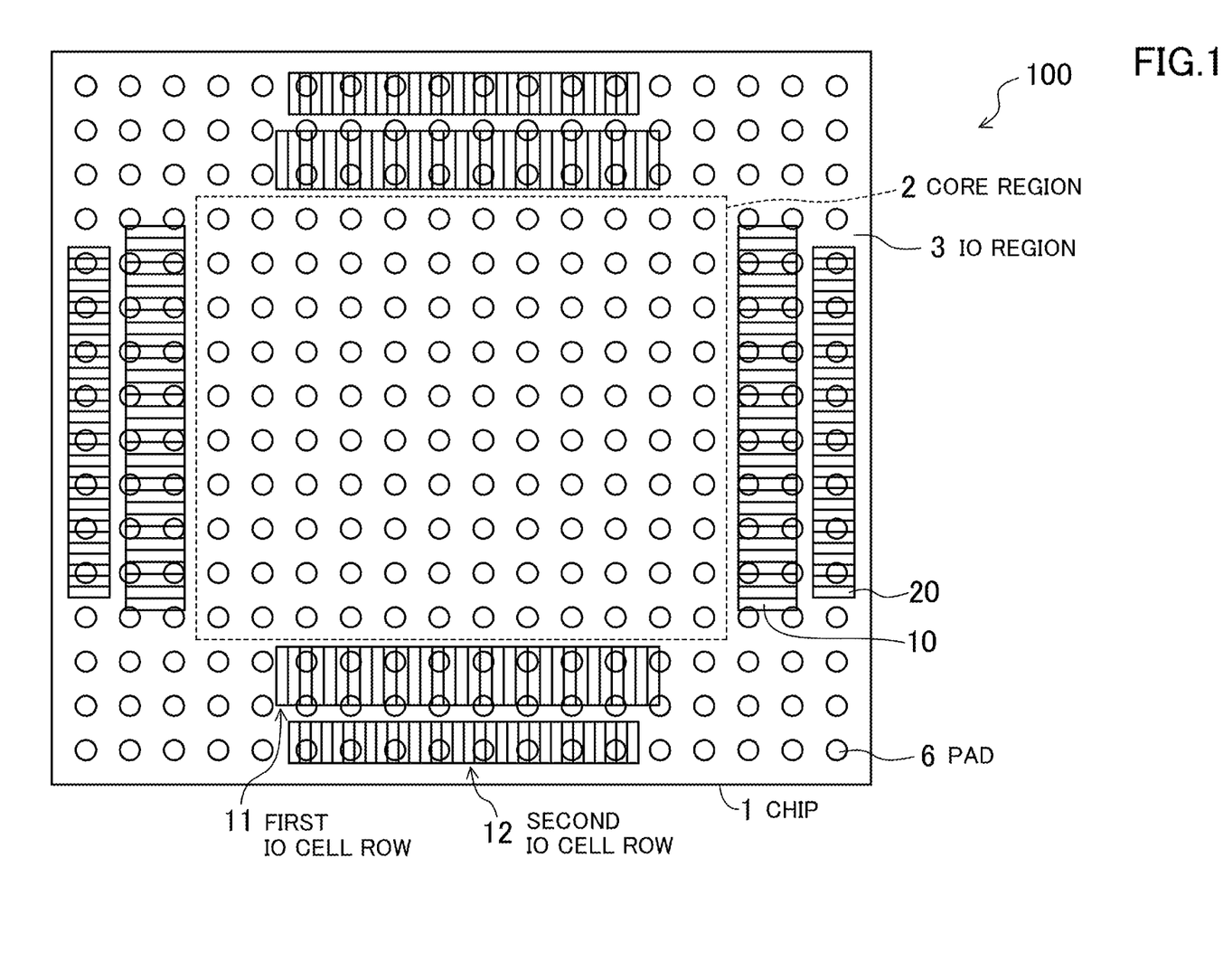
FIG. 1 is a schematic plan view showing a configuration of a semiconductor integrated circuit device according to an embodiment.

FIG. 1 is a plan view schematically showing the entire configuration of a semiconductor integrated circuit device (semiconductor chip) according to an embodiment. A semiconductor integrated circuit device 100 shown in FIG. 1 includes, on a chip 1, a core region 2 in which inner core circuits are formed and an IO region 3 in which interface circuits (IO circuits) are formed. The IO region 3 is located between the core region 2 and the outer edges of the chip 1. In FIG. 1, the IO region 3 is located around the core region 2.

In the IO region 3, first and second IO cell rows 11 and 12 are formed along the outer edges of the chip 1: the first IO cell row 11 is closer to the core region 2 and the second IO cell row 12 is between the first IO cell row 11 and the outer edges of the chip 1. Although illustration is simplified in FIG. 1, a plurality of IO cells 10 constituting interface circuits are arranged in the first IO cell row 11, and a plurality of IO cells 20 constituting interface circuits are arranged in the second IO cell row 12. In FIG. 1, the IO cells 10 are vertically longer than the IO cells 20 and larger in plane area than the IO cells 20.

The IO cells 10 and 20 include signal IO cells dedicated to input, output, or input/output of signals. The IO cells 10 and 20 also include IO power IO cells for supplying power mainly to the IO region 3, VSS IO cells for supplying the ground potential, and core power IO cells for supplying power mainly to the core region 2. The IO power IO cells, the VSS IO cells, and the core power IO cells are hereinafter collectively called the power IO cells as appropriate.

A plurality of pads (also called bumps) 6 are formed on a surface of the chip 1. The pads 6 are to be electrically connected with the outside of the semiconductor integrated circuit device 100, used for signal input/output and power supply. In FIG. 1, the pads 6 are placed in an array. The IO cells 10 and 20 are each connected to one of the pads 6. For example, the signal IO cells exchange signals with the outside of the semiconductor integrated circuit device 100 through the connected pads 6, and the power IO cells receive power from the outside of the semiconductor integrated circuit device 100 through the connected pads 6.

While two IO cell rows are provided around the entire periphery of the core region 2 in FIG. 1, the configuration is not limited to this. For example, the IO cell rows may be provided around only part of the periphery of the core region 2. Otherwise, one IO cell row, or three or more IO cell rows, may be provided around part of the periphery of the core region 2.

Figure 2:
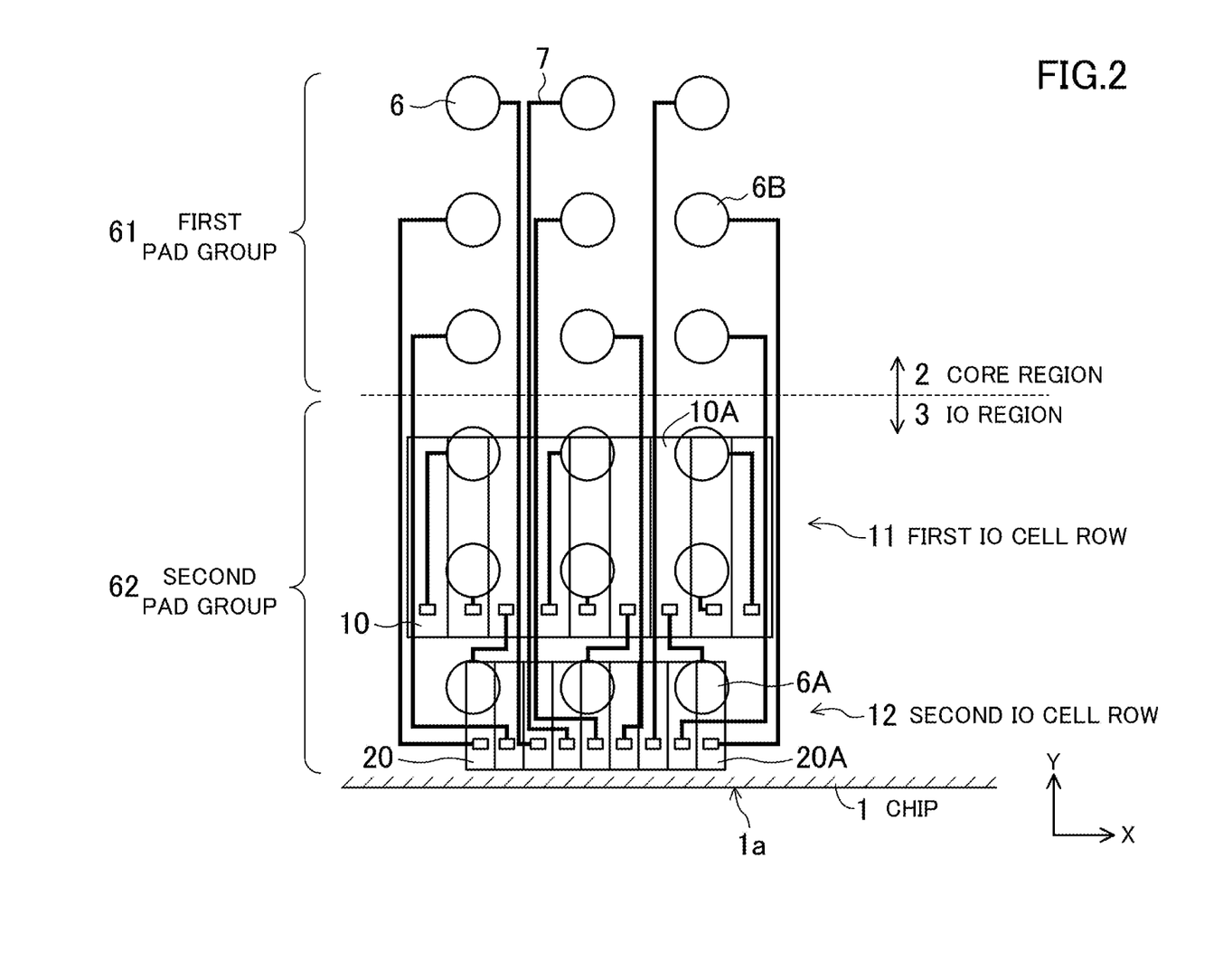
FIG. 2 is a partial enlarged view of a semiconductor integrated circuit device according to the first embodiment.

FIG. 2 is a partial enlarged view of a semiconductor integrated circuit device 100 according to this embodiment. FIG. 2 shows the placement of the first and second IO cell rows 11 and 12 and the pads 6 in a neighborhood of an outer edge 1a of the chip 1 at the bottom in FIG. 1. FIG. 2 also illustrates connecting lines 7 for connecting the IO cells 10 and 20 with the pads 6. In FIG. 2 and the subsequent partial enlarged views, the X direction (horizontal direction in the figure) refers to the direction along the outer edge 1a of the chip 1, and the Y direction refers to the direction from the outer edge 1a of the chip 1 toward the core region 2. It is to be noted that, in FIG. 2 and the subsequent partial enlarged views, the sizes and layout positions of the IO cells and the pads do not necessarily match with those in FIG. 1.

In FIG. 2, the IO cells 10 in the first IO cell row 11 are larger in plane area than the IO cells 20 in the second IO cell row 12: in FIG. 2, the IO cells 10 are larger in both sizes in the X and Y directions than the IO cells 20. In the IO cells 10 having a large plane area, large-sized transistors can be provided as transistors constituting a circuit. Therefore, the 10 cells 10 are mainly used as IO cells for propagation of high-speed signals. On the other hand, the IO cells 20 small in plane area are mainly used as IO cells for low-speed signals and as power IO cells.

The IO cells 10 in the first IO cell row 11 (nine cells in a row in FIG. 2) are individually connected to pads 6 closer to the outer edge 1a of the chip 1 ((3×3) pads in an array in FIG. 2). On the other hand, the 10 cells 20 in the second 10 cell row 12 (nine cells in a row in FIG. 2) are individually connected to pads 6 on the core region 2 side away from the outer edge 1a of the chip 1 ((3×3) pads in an array in FIG. 2).

In other words, the pads 6 connected to the 10 cells 10 in the first 10 cell row 11 are located closer to the outer edge 1a of the chip 1 than any of the pads 6 connected to the IO cells 20 in the second 10 cell row 12. Therefore, connecting lines 7 for connection of the 10 cells 10 in the first IO cell row 11 with the pads 6 are shorter than connecting lines 7 for connection of the 10 cells 20 in the second 10 cell row 12 with the pads 6.

Assuming that the plurality of pads 6 are divided into a first pad group 61 and a second pad group 62 closer to the outer edge 1a of the chip 1 than the first pad group 61, the pads 6 in the first pad group 61 are connected to the IO cells 20 in the second IO cell row 12 and the pads 6 in the second pad group 62 are connected to the 10 cells 10 in the first 10 cell row 11.

An IO cell 10A in the first IO cell row 11, for example, is connected to a pad 6A that is closer to the outer edge 1a of the chip 1 than the IO cell 10A itself. An IO cell 20A in the second IO cell row 12, for example, is connected to a pad 6B that is farther from the outer edge 1a of the chip 1 than the IO cell 20A itself. Also, like the pad 6A, for example, a pad overlapping the second IO cell row 12 as viewed in plan is connected to an IO cell 10 in the first IO cell row 11, not an IO cell 20 in the second IO cell row 12.

According to this embodiment, in the semiconductor integrated circuit device 100, the first and second IO cell rows 11 and 12 are placed in the IO region 3 on the chip 1. The second IO cell row 12 is placed between the first IO cell row 11 and the outer edge 1a of the chip 1. The IO cells 10 in the first IO cell row 11 are larger in plane area than the IO cells 20 in the second IO cell row 12. That is, the IO cells 10 in the first IO cell row 11, in which large-sized transistors can be provided, are suitable for configuration of circuits for propagation of high-speed signals. The pads 6 connected to the IO cells 10 in the first IO cell row 11 are closer to the outer edge 1a of the chip 1 than any of the pads 6 connected to the IO cells 20 in the second IO cell row 12. Therefore, for the IO cells 10 for high-speed signals arranged in the first IO cell row 11, the line length to internal circuits provided in the core region 2 is short, and also the line length to the pads 6 can be shortened. This reduces signal delays and thus facilitates propagation of high-speed signals.

Alteration 1

Figure 3:
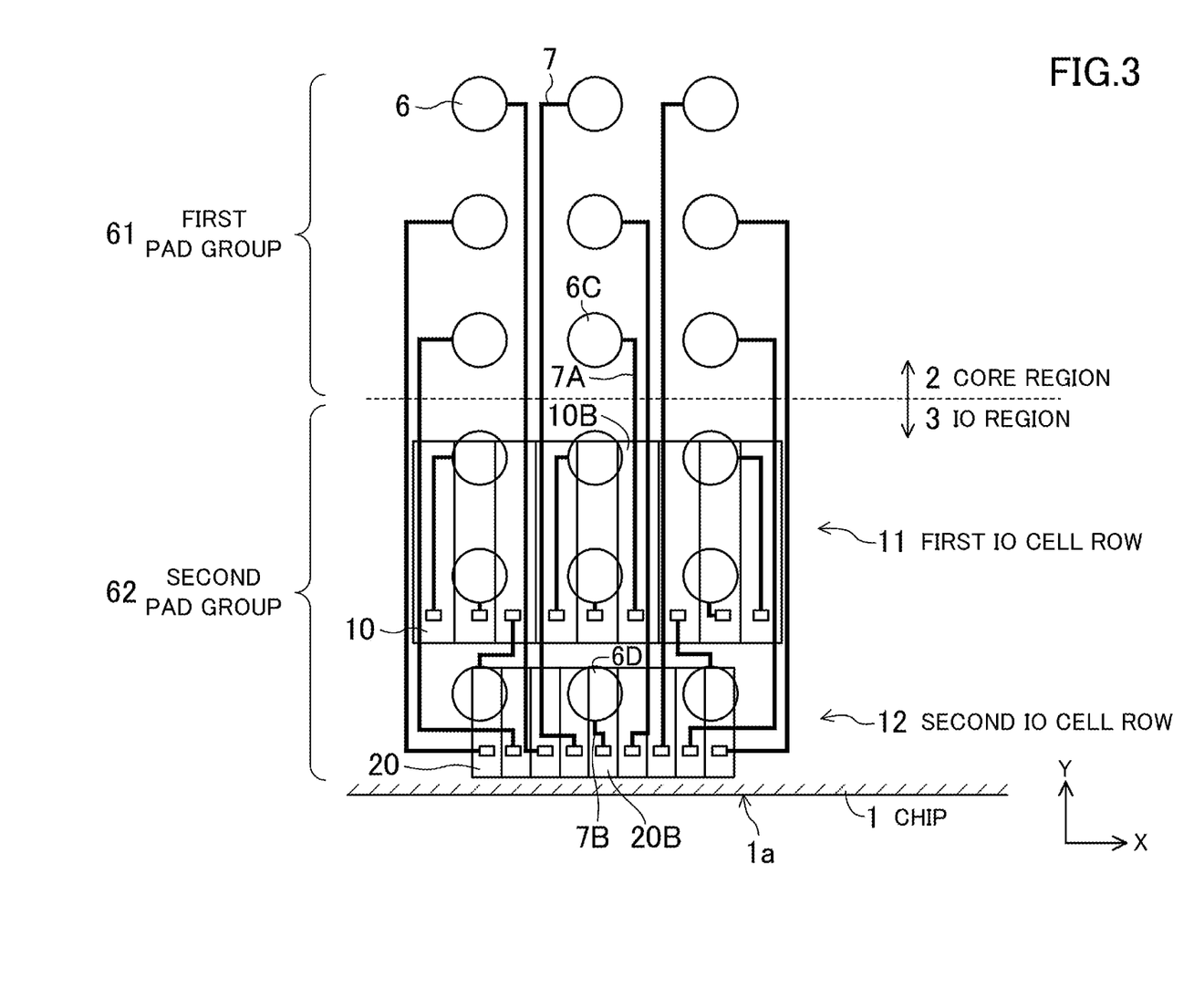
FIG. 3 is a partial enlarged view of a semiconductor integrated circuit device according to Alteration 1 of the first embodiment.

FIG. 3 is a partial enlarged view showing Alteration 1 of the first embodiment. The configuration of FIG. 3 is similar to the configuration of FIG. 2, except that the pad 6 connected to an IO cell 10B in the first IO cell row 11 and the pad 6 connected to an IO cell 20B in the second IO cell row 12 are exchanged. That is, the IO cell 10B is connected to a pad 6C in the fourth row from the outer edge 1a of the chip 1 through a connecting line 7A, and the IO cell 20B is connected to a pad 6D in the row closest to the outer edge 1a of the chip 1 through a connecting line 7B. This relieves the degree of congestion of lines and thus improves the ease of routing, compared with the configuration of FIG. 2.

In the configuration of FIG. 3, also, features similar to those in the configuration of FIG. 2 are presented. For example, the pads 6 in the first pad group 61, except for the pad 6C connected to the IO cell 10B, are connected to the IO cells 20 in the second IO cell row 12. The pads 6 in the second pad group 62, except for the pad 6D connected to the IO cell 20B, are connected to the IO cells 10 in the first IO cell row 11. That is, the first pad group 61 includes pads 6 connected to the IO cells 20 in the second IO cell row 12 in larger number than pads 6 connected to the IO cells 10 in the first IO cell row 11. The second pad group 62 includes pads 6 connected to the IO cells 10 in the first IO cell row 11 in larger number than pads 6 connected to the IO cells 20 in the second IO cell row 12.

Also, focus on the three IO cells 10 from the right in the figure in the first IO cell row 11 and the three IO cells 20 from the right in the figure in the second IO cell row 12, for example. This corresponds to the understanding that the first and second IO cell rows 11 and 12 are each constituted by three IO cells from the right in the figure in the configuration of FIG. 3. In this case, as in the configuration of FIG. 2, the pads 6 connected to the IO cells 10 in the first IO cell row 11 are located closer to the outer edge 1a of the chip 1 than any of the pads 6 connected to the IO cells 20 in the second IO cell row 12. Therefore, the connecting lines 7 for connection of the IO cells 10 in the first IO cell row 11 with the pads 6 are shorter than the connecting lines 7 for connection of the IO cells 20 in the second IO cell row 12 with the pads 6.

Therefore, in Alteration 1, as in the configuration of FIG. 2, since signal delays are reduced for the IO cells 10 for high-speed signals arranged in the first IO cell row 11, propagation of high-speed signals is facilitated.

Alteration 2

Figure 4:
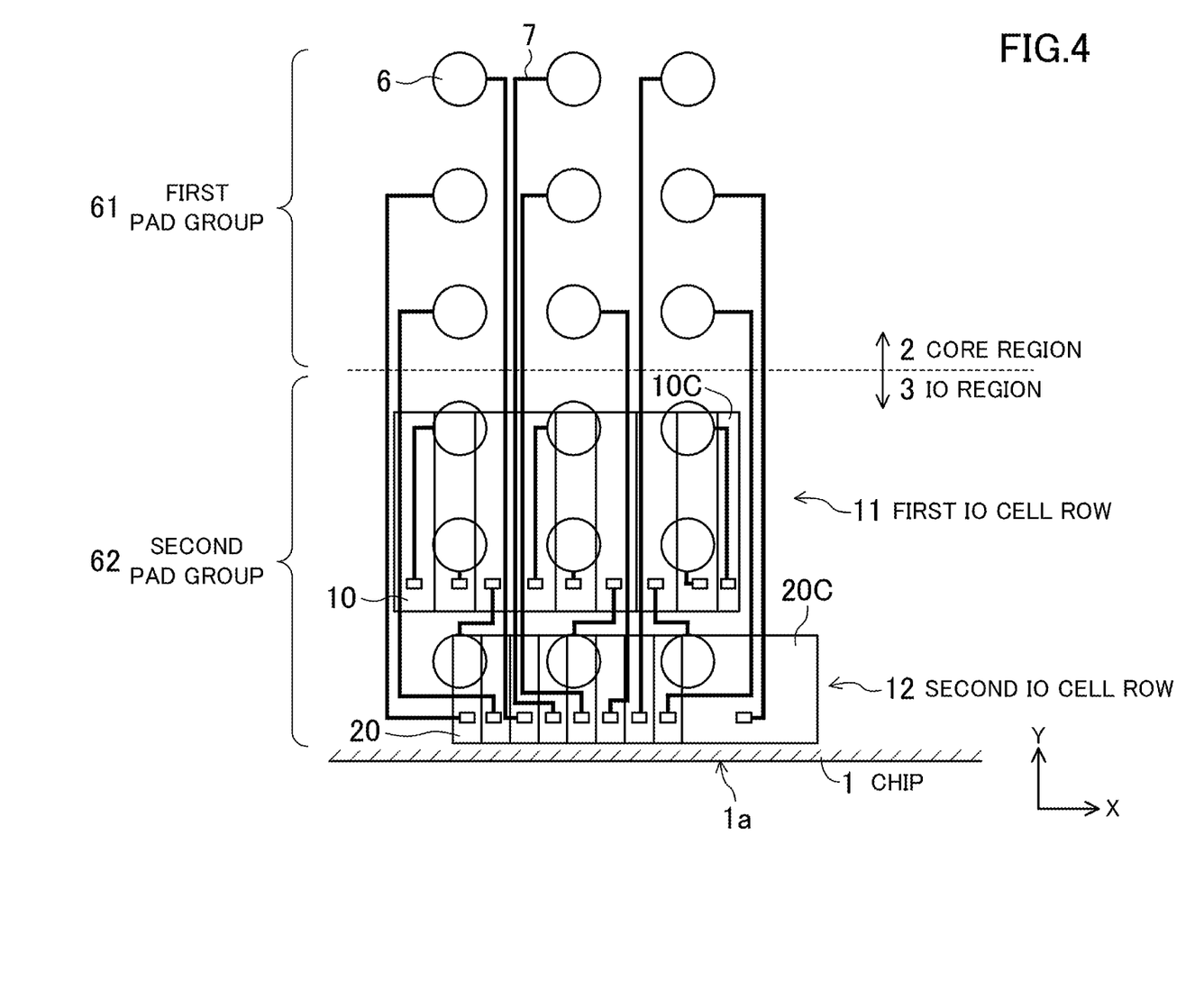
FIG. 4 is a partial enlarged view of a semiconductor integrated circuit device according to Alteration 2 of the first embodiment.

FIG. 4 is a partial enlarged view showing Alteration 2 of the first embodiment. The configuration of FIG. 4 is similar to the configuration of FIG. 2, except that, in the first IO cell row 11, the area of an IO cell 10C at the right end in the figure is smaller than that of the other IO cells 10 and, in the second IO cell row 12, the area of an IO cell 20C at the right end in the figure is larger than that of the other IO cells 20. As in this example of FIG. 4, some of the IO cells in each IO cell row may be different in area from other IO cells.

Alteration 3

Figure 5:
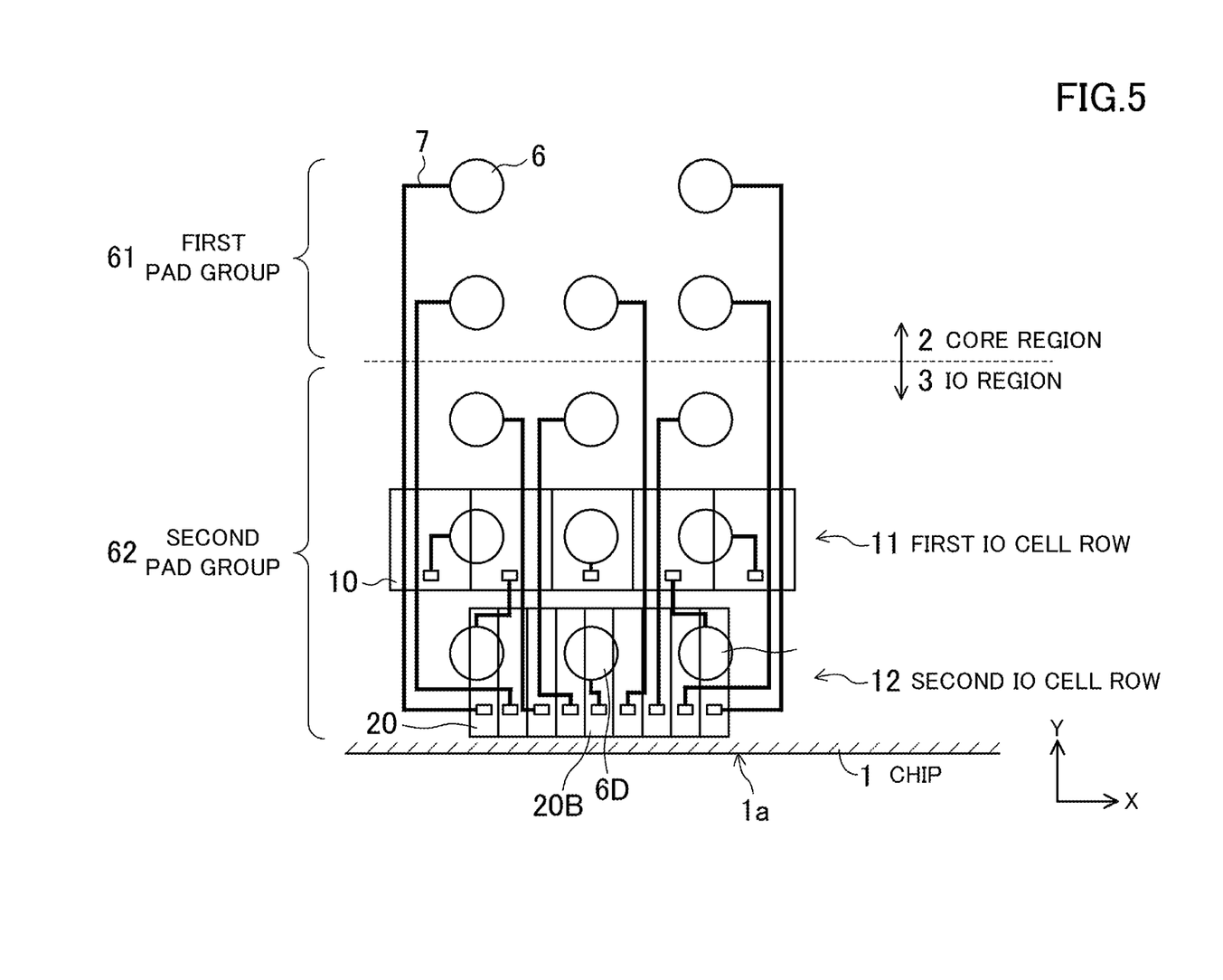
FIG. 5 is a partial enlarged view of a semiconductor integrated circuit device according to Alteration 3 of the first embodiment.

FIG. 5 is a partial enlarged view showing Alteration 3 of the first embodiment. The configuration of FIG. 5 is similar to the configuration of FIG. 2, except that the IO cells 10 in the first IO cell row 11 are larger in size in the X direction and smaller in size in the Y direction, compared with those in FIG. 2. The plane area is however larger in the IO cells 10 in the first IO cell row 11 than in the IO cells 20 in the second IO cell row 12, as in the configuration of FIG. 2.

The IO cells 10 in the first IO cell row 11 (five cells in a row in FIG. 5) are individually connected to pads 6 closer to the outer edge 1a of the chip 1 (two pads in the row closest to the outer edge 1a and three pads in the second closest row in FIG. 5). On the other hand, the IO cells 20 in the second IO cell row 12 (nine cells in a row in FIG. 5), except for an IO cell 20B, are individually connected to pads 6 away from the outer edge 1a of the chip 1 (three pads in the third row, three pads in the fourth row, and two pads in the fifth row, from the outer edge 1a). The IO cell 20B is connected to a pad 6D in the row closest to the outer edge 1a.

Therefore, except for the IO cell 20B, the pads 6 connected to the IO cells 10 in the first IO cell row 11 are located closer to the outer edge 1a of the chip 1 than any of the pads 6 connected to the IO cells 20 in the second IO cell row 12. Thus, connecting lines 7 for connection of the IO cells 10 in the first IO cell row 11 with the pads 6 are shorter than connecting lines 7 for connection of the IO cells 20 in the second IO cell row 12 with the pads 6.

Also, the first pad group 61 includes pads 6 connected to the IO cells 20 in the second IO cell row 12 but does not include pads 6 connected to the IO cells 10 in the first IO cell row 11. The second pad group 62 includes pads 6 connected to the IO cells 10 in the first IO cell row 11 in larger number than pads 6 connected to the IO cells 20 in the second IO cell row 12.

Therefore, in Alteration 3, as in the configuration of FIG. 2, since signal delays are reduced for the IO cells 10 for high-speed signals arranged in the first IO cell row 11, propagation of high-speed signals is facilitated.

Second Embodiment

In the second embodiment, a configuration in which three IO cell rows are placed in the IO region will be described.

Figure 6:
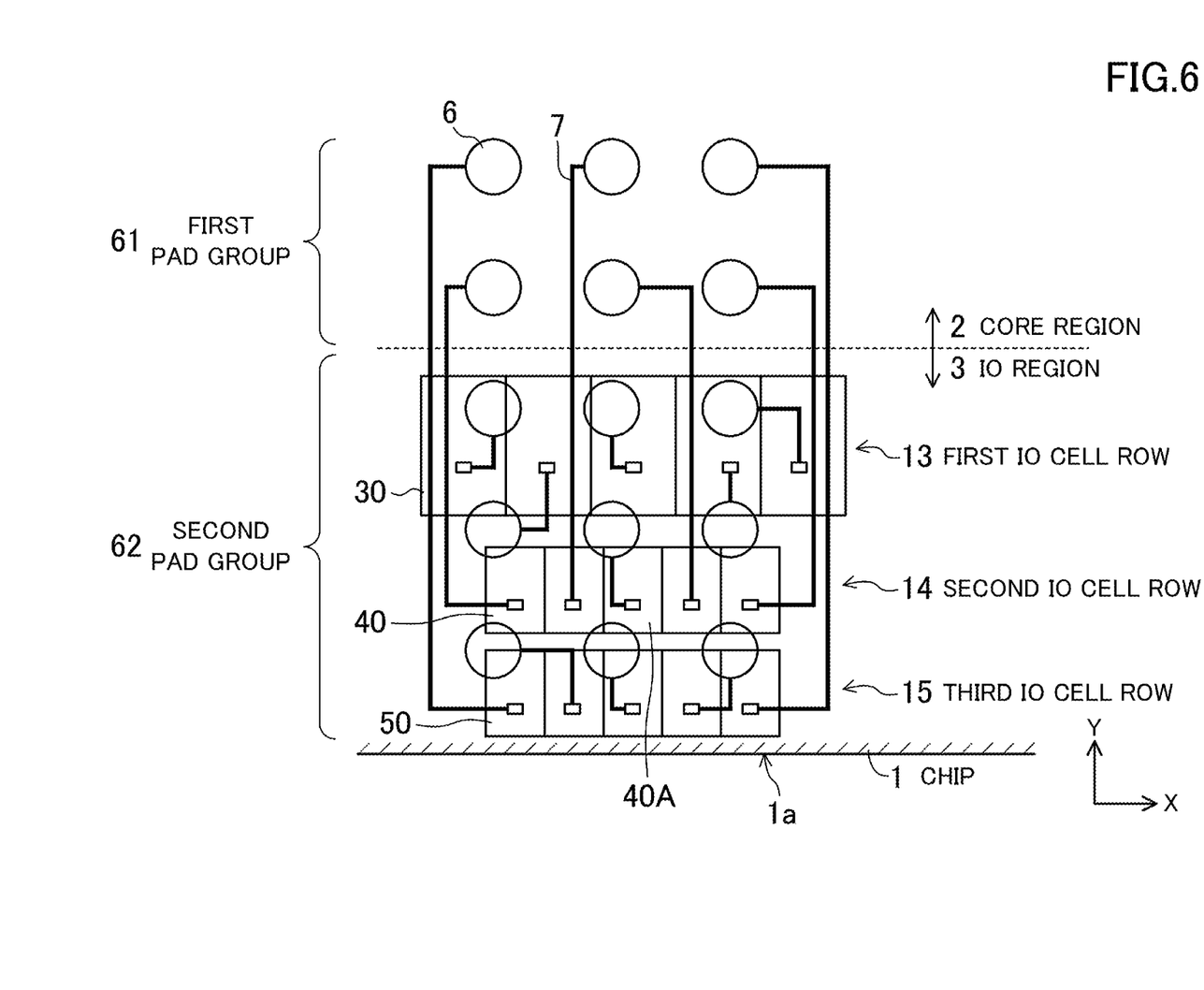
FIG. 6 is a partial enlarged view of a semiconductor integrated circuit device according to the second embodiment.

FIG. 6 is a partial enlarged view of a semiconductor integrated circuit device 100 according to this embodiment. Like FIGS. 2 to 5, FIG. 6 shows the placement in a neighborhood of the outer edge 1a of the chip 1 at the bottom in FIG. 1. While only two IO cell rows are shown in FIG. 1, it is assumed in this embodiment that three IO cell rows are placed. In FIG. 6, a first IO cell row 13, a second IO cell row 14, and a third IO cell row 15 are placed in this order from the side closer to the core region 2.

In FIG. 6, IO cells 30 in the first IO cell row 13 are larger in plane area than IO cells 40 in the second IO cell row 14 and IO cells 50 in the third IO cell row 15: in FIG. 6, the IO cells 30 are larger in both sizes in the X and Y directions than the IO cells 40 and 50. In the IO cells 30 having a large plane area, large-sized transistors can be provided as transistors constituting a circuit. Therefore, the IO cells 30 are mainly used as IO cells for propagation of high-speed signals. On the other hand, the IO cells 40 and 50 small in plane area are mainly used as IO cells for low-speed signals and as power IO cells.

The IO cells 30 in the first IO cell row 13 (five cells in a row in FIG. 6) are individually connected to pads 6 located nearby (two pads in the second row and three pads in the third row from the outer edge 1a of the chip 1). On the other hand, the IO cells 40 in the second IO cell row 14 (five cells in a row in FIG. 6), except for an IO cell 40A, are individually connected to pads 6 on the core region 2 side away from the outer edge 1a of the chip 1 (three pads in the fourth row and one pad in the fifth row from the outer edge 1a of the chip 1). The IO cell 40A is connected to a pad 6 on the second row from the outer edge 1a of the chip 1. Also, the IO cells 50 in the third IO cell row 15 (five cells in a row in FIG. 6) are individually connected to three pads 6 in the row closest to the outer edge 1a of the chip 1 and two pads 6 in the fifth row.

Here, focusing on the first IO cell row 13 and the second IO cell row 14, features similar to those in the first embodiment are presented. That is, except for the IO cell 40A, the pads 6 connected to the IO cells 30 in the first IO cell row 13 are located closer to the outer edge 1a of the chip 1 than any of the pads 6 connected to the IO cells 40 in the second IO cell row 14. Therefore, connecting lines 7 for connection of the IO cells 30 in the first IO cell row 13 with the pads 6 are shorter than connecting lines 7 for connection of the IO cells 40 in the second IO cell row 14 with the pads 6.

Also, the first pad group 61 includes pads 6 connected to the IO cells 40 in the second IO cell row 14 but does not include pads 6 connected to the IO cells 30 in the first IO cell row 13. The second pad group 62 includes pads 6 connected to the IO cells 30 in the first IO cell row 13 in larger number than pads 6 connected to the IO cells 40 in the second IO cell row 14.

According to this embodiment, similar effects to those obtained in the first embodiment can be obtained. That is, for the IO cells for high-speed signals arranged in the first IO cell row 13, the line length to internal circuits provided in the core region 2 is short, and also the line length to the pads 6 can be shortened. This reduces signal delays and thus facilitates propagation of high-speed signals.

Alteration 1

Figure 7:
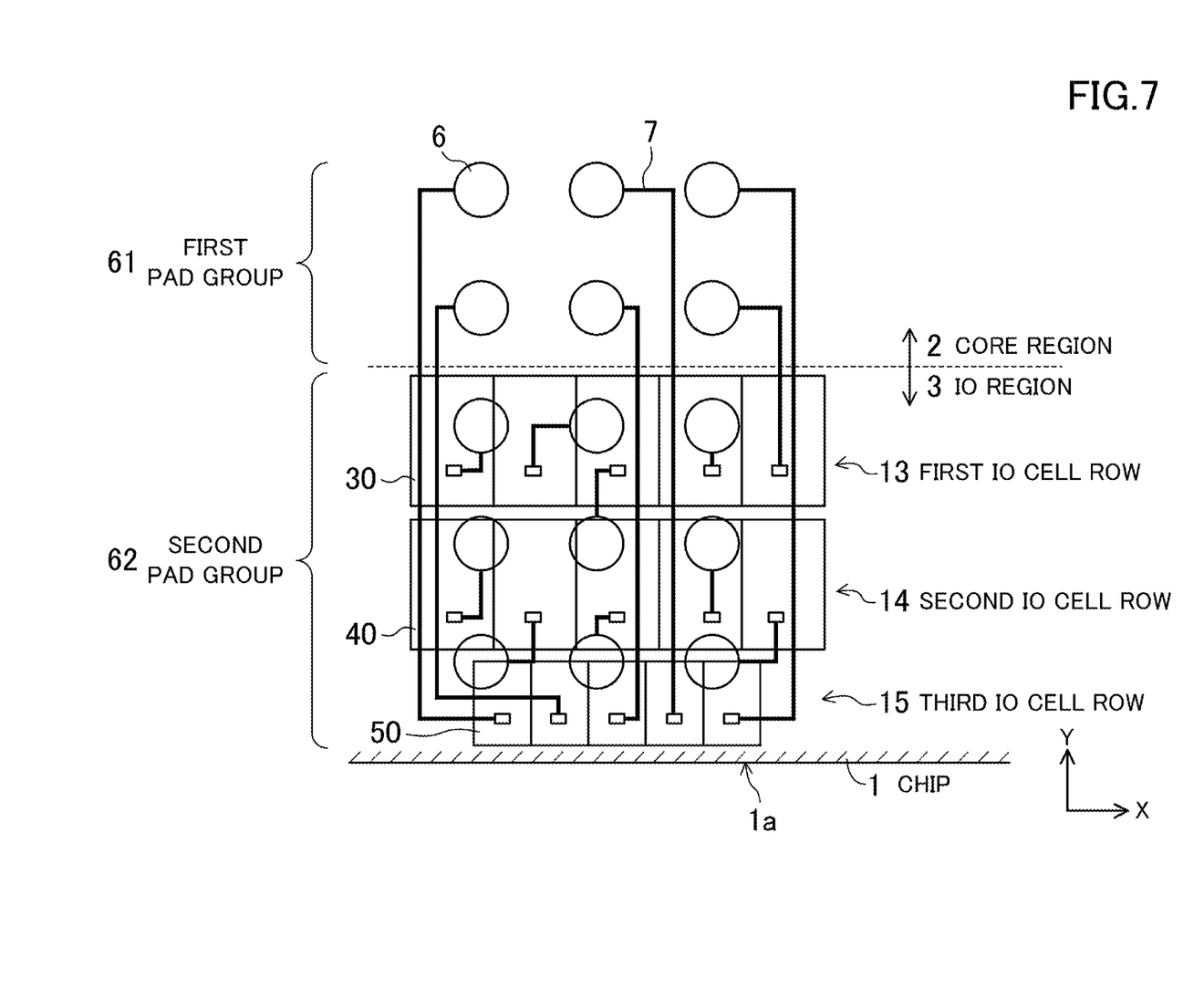
FIG. 7 is a partial enlarged view of a semiconductor integrated circuit device according to Alteration 1 of the second embodiment.

FIG. 7 is a partial enlarged view showing Alteration 1 of the second embodiment. In FIG. 7, the IO cells 30 in the first IO cell row 13 and the IO cells 40 in the second IO cell row 14 are larger in plane area than the IO cells 50 in the third IO cell row 15. In the IO cells 30 and 40 having a large plane area, large-sized transistors can be provided as transistors constituting a circuit. Therefore, the IO cells 30 and 40 are mainly used as IO cells for propagation of high-speed signals. On the other hand, the IO cells 50 small in plane area are mainly used as IO cells for low-speed signals and as power IO cells.

Here, focusing on the second IO cell row 14 and the third IO cell row 15, features similar to those in the first embodiment are presented. That is, the IO cells 40 in the second IO cell row 14 are connected to pads 6 closer to the outer edge 1a of the chip 1, and the IO cells 50 in the third IO cell row 15 are connected to pads 6 on the core region 2 side away from the outer edge 1a of the chip 1. In other words, the pads 6 connected to the IO cells 40 in the second IO cell row 14 are located closer to the outer edge 1a of the chip 1 than any of the pads 6 connected to the IO cells 50 in the third IO cell row 15. Therefore, connecting lines 7 for connection of the IO cells 40 in the second IO cell row 14 with the pads 6 are shorter than connecting lines 7 for connection of the IO cells 50 in the third IO cell row 15 with the pads 6.

Also, the first pad group 61 includes pads 6 connected to the IO cells 50 in the third IO cell row 15 but does not include pads 6 connected to the IO cells 40 in the second IO cell row 14. The second pad group 62 includes pads 6 connected to the IO cells 40 in the second IO cell row 14 but does not include pads 6 connected to the IO cells 50 in the third IO cell row 15.

Therefore, in Alteration 1, also, as in the configuration of FIG. 6, since signal delays are reduced for the IO cells 40 for high-speed signals arranged in the second IO cell row 14, propagation of high-speed signals is facilitated.

Note that a core region may be provided between the first IO cell row 13 and the second IO cell row 14 to place therein an internal circuit that conducts input/output of signals with the IO cells 14. This will further reduce signal delays between the IO cells 40 for high-speed signals in the second IO cell row 14 and the internal circuit.

Alteration 2

Figure 8:
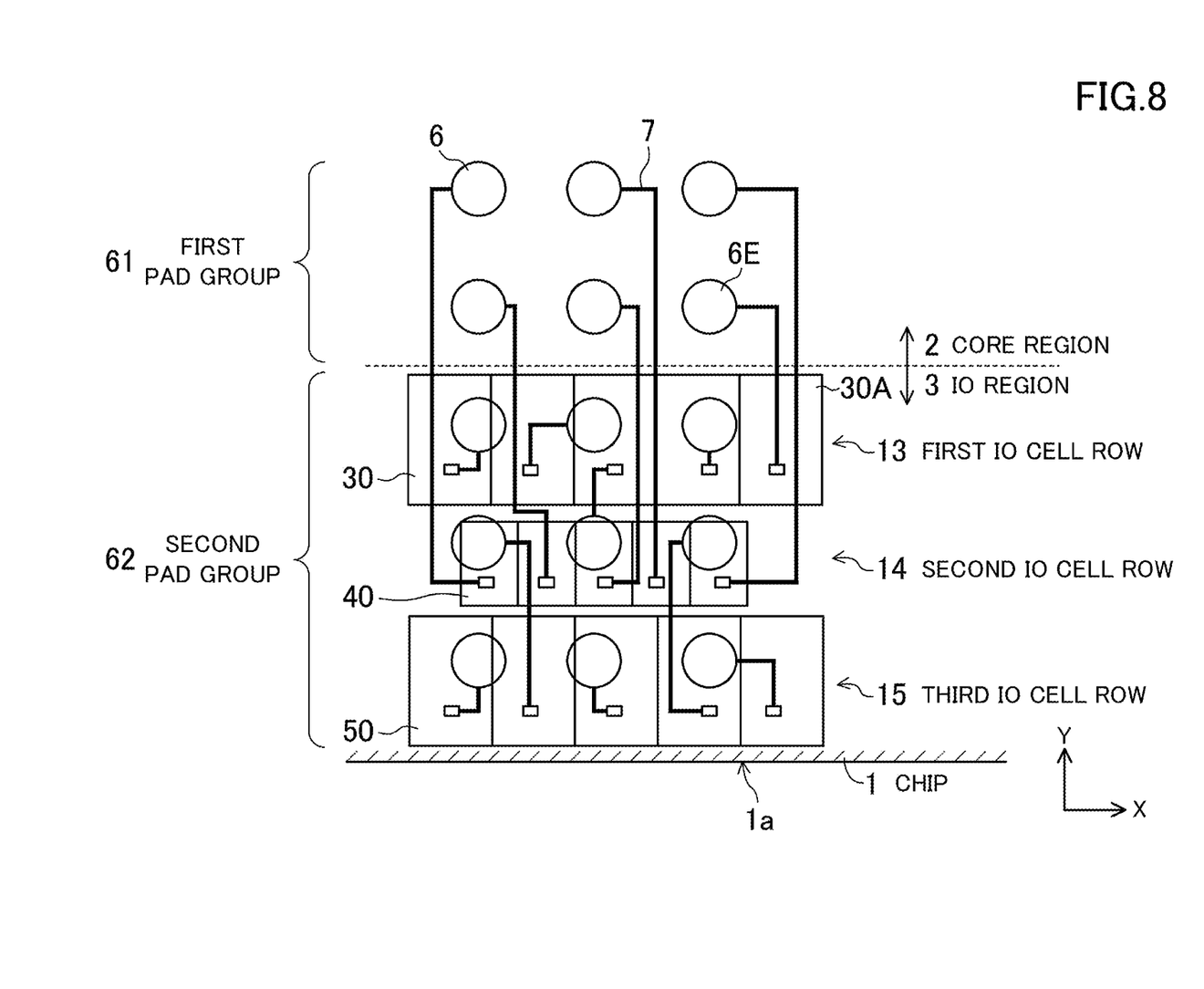
FIG. 8 is a partial enlarged view of a semiconductor integrated circuit device according to Alteration 2 of the second embodiment.

FIG. 8 is a partial enlarged view showing Alteration 2 of the second embodiment. In FIG. 8, the IO cells 30 in the first IO cell row 13 and the IO cells 50 in the third IO cell row 15 are larger in plane area than the IO cells 40 in the second IO cell row 14. In the IO cells 30 and 50 having a large plane area, large-sized transistors can be provided as transistors constituting a circuit. Therefore, the IO cells 30 and 50 are mainly used as IO cells for propagation of high-speed signals. On the other hand, the IO cells 40 small in plane area are mainly used as IO cells for low-speed signals and as power IO cells.

Here, focusing on the first IO cell row 13 and the second IO cell row 14, features similar to those in the first embodiment are presented. That is, except for an IO cell 30A, the IO cells 30 in the first IO cell row 13 are connected to pads 6 closer to the outer edge 1a of the chip 1, and the IO cells 40 in the second IO cell row 14 are connected to pads 6 on the core region 2 side away from the outer edge 1a of the chip 1. In other words, the pads 6 connected to the IO cells 30 in the first IO cell row 13, except for a pad 6E connected to the IO cell 30A, are located closer to the outer edge 1a of the chip 1 than any of the pads 6 connected to the IO cells 40 in the second IO cell row 14. Therefore, connecting lines 7 for connection of the IO cells 30 in the first IO cell row 13 with the pads 6 are shorter than connecting lines 7 for connection of the IO cells 40 in the second IO cell row 14 with the pads 6.

Also, the first pad group 61 includes pads 6 connected to the IO cells 40 in the second IO cell row 14 in larger number than pads 6 connected to the IO cells 30 in the first IO cell row 13. The second pad group 62 includes pads 6 connected to the IO cells 30 in the first IO cell row 13 in larger number than pads 6 connected to the IO cells 40 in the second IO cell row 14.

Therefore, in Alteration 2, also, as in the configuration of FIG. 6, since signal delays are reduced for the IO cells 30 for high-speed signals arranged in the first IO cell row 13, propagation of high-speed signals is facilitated.

In the embodiments and alterations described above, while the IO cells in each IO cell row are illustrated to have a uniform height (size in the Y direction), the configuration is not limited to this. Each IO cell row may include IO cells different in height.

According to the present disclosure, in a semiconductor integrated circuit device in which a plurality of IO cell rows are placed, propagation of high-speed signals is facilitated. The present disclosure is therefore useful for improving the performance of the semiconductor integrated circuit device, for example.

What is claimed is:

1. A semiconductor integrated circuit device, comprising:
a chip;
a core region provided on the chip;
an IO region provided on the chip between the core region and an outer edge of the chip;
a first IO cell row placed in the IO region, including at least two IO cells arranged in a first direction that is a direction along the outer edge;
a second IO cell row placed in the IO region, including at least two IO cells arranged in the first direction, located between the first IO cell row and the outer edge; and
a plurality of pads formed on a surface of the chip, individually connected to the IO cells in the first and second IO cell rows and electrically connected to the outside of the semiconductor integrated circuit device, wherein
the IO cells in the first IO cell row are larger in plane area than the IO cells in the second IO cell row, and
the pads connected to the IO cells in the first IO cell row are located closer to the outer edge than any of the pads connected to the IO cells in the second IO cell row.

2. The semiconductor integrated circuit device of claim 1, further comprising:
a third IO cell row placed in the IO region, including at least two IO cells arranged in the first direction, located between the second IO cell row and the outer edge or located closer to the core region than the first IO cell row.

3. A semiconductor integrated circuit device, comprising:
a chip;
a core region provided on the chip;
an IO region provided on the chip, between the core region and an outer edge of the chip;
a first IO cell row placed in the IO region, including at least two IO cells arranged in a first direction that is a direction along the outer edge;
a second IO cell row placed in the IO region, including at least two IO cells arranged in the first direction, located between the first IO cell row and the outer edge; and
a plurality of pads formed on a surface of the chip, individually connected to the IO cells in the first and second IO cell rows and electrically connected to the outside of the semiconductor integrated circuit device, wherein
the IO cells in the first IO cell row are larger in plane area than the IO cells in the second IO cell row, and
when the plurality of pads are divided into a first pad group and a second pad group closer to the outer edge than the first pad group, the first pad group includes pads connected to the IO cells in the second IO cell row in larger number than pads connected to the IO cells in the first IO cell row, and the second pad group includes pads connected to the IO cells in the first IO cell row in larger number than pads connected to the IO cells in the second IO cell row.

4. The semiconductor integrated circuit device of claim 3, further comprising:
a third IO cell row placed in the IO region, including at least two IO cells arranged in the first direction, located between the second IO cell row and the outer edge or located closer to the core region than the first IO cell row.

5. A semiconductor integrated circuit device, comprising:
a chip;
a core region provided on the chip;
an IO region provided on the chip, between the core region and an outer edge of the chip;
a first IO cell row placed in the IO region, including at least two IO cells arranged in a first direction that is a direction along the outer edge;
a second IO cell row placed in the IO region, including at least two IO cells arranged in the first direction, located between the first IO cell row and the outer edge; and
a plurality of pads formed on a surface of the chip, individually connected to the IO cells in the first and second IO cell rows and electrically connected to the outside of the semiconductor integrated circuit device, wherein the IO cells in the first IO cell row are larger in plane area than the IO cells in the second IO cell row, and at least one IO cell in the first IO cell row is connected to a pad of the plurality of pads located closer to the outer edge than the IO cell itself, and at least one IO cell in the second IO cell row is connected to a pad of the plurality of pads located farther from the outer edge than the IO cell itself.

6. The semiconductor integrated circuit device of claim 5, further comprising:

a third IO cell row placed in the IO region, including at least two IO cells arranged in the first direction, located between the second IO cell row and the outer edge or located closer to the core region than the first IO cell row.

* * * * *